(12) United States Patent
Koike

(10) Patent No.: US 11,903,144 B2
(45) Date of Patent: Feb. 13, 2024

(54) ELECTRONIC COMPONENT AND METHOD FOR PRODUCING SAME

(71) Applicant: Material Concept, Inc., Sendai (JP)

(72) Inventor: Junichi Koike, Sendai (JP)

(73) Assignee: MATERIAL CONCEPT, INC., Sendai (JP)

( * ) Notice: Subject to any disclaimer, the term of this patent is extended or adjusted under 35 U.S.C. 154(b) by 129 days.

(21) Appl. No.: 17/421,200

(22) PCT Filed: Jan. 9, 2020

(86) PCT No.: PCT/JP2020/000517
§ 371 (c)(1),
(2) Date: Jul. 7, 2021

(87) PCT Pub. No.: WO2020/145360
PCT Pub. Date: Jul. 16, 2020

(65) Prior Publication Data
US 2022/0071024 A1    Mar. 3, 2022

(30) Foreign Application Priority Data
Jan. 10, 2019 (JP) .................................. 2019-002834

(51) Int. Cl.
*H05K 3/38* (2006.01)
*B22F 7/04* (2006.01)
(Continued)

(52) U.S. Cl.
CPC .............. *H05K 3/388* (2013.01); *B22F 7/04* (2013.01); *C04B 37/025* (2013.01);
(Continued)

(58) Field of Classification Search
CPC ........ H05K 1/09; H05K 1/0306; H05K 3/388; B22F 7/04; B22F 2007/042
(Continued)

(56) References Cited

U.S. PATENT DOCUMENTS 4,172,919 A * 10/1979 Mitchell .................. H01B 1/16
428/209
5,035,837 A * 7/1991 Saeki ....................... H01B 1/16
501/19
(Continued)

FOREIGN PATENT DOCUMENTS

JP    H10233119 A    9/1998
JP    H10283840 A    10/1998
(Continued)

OTHER PUBLICATIONS

International Search Report for International Application No. PCT/JP2020/000517; dated Mar. 3, 3020.

*Primary Examiner* — Brian K Talbot
(74) *Attorney, Agent, or Firm* — CANTOR COLBURN LLP

(57) ABSTRACT

The purpose of the present invention is to provide an electronic component in which a copper electrode and an inorganic substrate exhibit strong adhesion to each other. A method for producing an electronic component according to the present invention comprises: an application step wherein a paste is applied onto an inorganic substrate, which paste contains copper particles, copper oxide particles and/or nickel oxide particles, and inorganic oxide particles having a softening point; a sintering step wherein a sintered body which contains at least copper is formed by means of heating in an inert gas atmosphere at a temperature that is less than the softening point of the inorganic oxide particles but not less than the sintering temperature of the copper particles; and a softening step wherein heating is carried out in an inert gas atmosphere at a temperature that is not less than the softening point of the inorganic oxide particles.

15 Claims, 2 Drawing Sheets

(51) Int. Cl.
   *C04B 37/02* (2006.01)
   *H05K 1/03* (2006.01)
   *H05K 1/09* (2006.01)

(52) U.S. Cl.
   CPC ............ *H05K 1/0306* (2013.01); *H05K 1/09* (2013.01); *B22F 2007/042* (2013.01); *C04B 2235/32* (2013.01)

(58) Field of Classification Search
   USPC .................................................... 427/376.1
   See application file for complete search history.

(56) References Cited

U.S. PATENT DOCUMENTS

| | | | | |
|---|---|---|---|---|
| 5,503,787 | A * | 4/1996 | Tanei | C04B 35/645 |
| | | | | 156/89.12 |
| 5,976,628 | A | 11/1999 | Kawahara et al. | |
| 10,433,427 | B2 * | 10/2019 | Koike | B22F 3/10 |
| 2005/0219789 | A1 * | 10/2005 | Akimoto | H01C 1/148 |
| | | | | 361/306.1 |
| 2007/0080329 | A1 * | 4/2007 | Nomiya | H05K 1/092 |
| | | | | 252/500 |
| 2009/0161022 | A1 * | 6/2009 | Suzuki | H01J 9/027 |
| | | | | 174/250 |
| 2010/0067170 | A1 * | 3/2010 | Koga | H01G 4/232 |
| | | | | 29/25.42 |
| 2011/0051314 | A1 * | 3/2011 | Sakurai | H01G 4/30 |
| | | | | 361/321.1 |
| 2014/0268589 | A1 * | 9/2014 | Nakamura | H01L 23/49827 |
| | | | | 174/262 |
| 2015/0144385 | A1 * | 5/2015 | Ohashi | H05K 3/388 |
| | | | | 174/258 |
| 2016/0190361 | A1 * | 6/2016 | Yan | C03C 3/122 |
| | | | | 252/514 |
| 2016/0265758 | A1 * | 9/2016 | Funakoshi | H01L 25/0753 |
| 2018/0061576 | A1 * | 3/2018 | Nakamura | H01G 4/2325 |
| 2019/0035703 | A1 * | 1/2019 | Nishimoto | H01L 24/29 |

FOREIGN PATENT DOCUMENTS

| | | |
|---|---|---|
| JP | 2002151810 A | 5/2002 |
| JP | 2005209404 A | 8/2005 |
| JP | 2008226771 A | 9/2008 |
| JP | 2011119343 A | 6/2011 |
| JP | 2011192608 A | 9/2011 |
| WO | 2013191288 A1 | 12/2013 |

* cited by examiner

ELECTRONIC COMPONENT AND METHOD FOR PRODUCING SAME

CROSS REFERENCE TO RELATED APPLICATIONS

This is the U.S. national stage of application No. PCT/JP2020/000517, filed on Jan. 9, 2020. Priority under 35 U.S.C. § 119(a) and 35 U.S.C. § 365(b) is claimed from Japanese Application No. 2019-002834, filed Jan. 10, 2019, the disclosure of which is also incorporated herein by reference.

TECHNICAL FIELD

The present invention relates to an electronic component and a method for manufacturing the same, and in more detail, to an electronic component in which a copper electrode and an inorganic substrate exhibit strong adhesion to each other, which has a low resistance, and which is inexpensive, and to a method for manufacturing the same.

BACKGROUND ART

Conventionally, as a typical substrate material used in electronic components, ceramic substrates, such as oxide substrates (glass, quartz, aluminum oxide, gallium oxide, barium titanate, lead zirconate titanate, oxide such as ferrites, etc.), nitride substrates (aluminum nitride, silicon nitride, gallium nitride, etc.), and carbide substrates (silicon carbide, etc.) can be mentioned. Such ceramic substrates are used in electronic components for a wide range of applications, such as wireless communication devices and power conversion devices, etc.

Electronic components are formed by forming planar electrodes on surfaces of such ceramic substrates for electronic components.

As a method for forming an electrode on a ceramic substrate, a method for printing a conductive paste, followed by sintering can be mentioned. Inexpensive electronic components can be provided by such a method. Further, even more inexpensive electronic components may be provided by using a copper paste as a conductive paste.

However, since copper has poor adhesion to ceramics, copper electrodes may peel off in some cases from the ceramic substrates due to stress load during the manufacturing process of the electronic component, or stress load caused by a temperature cycle, etc. during use as an electronic component. In order to prevent such peeling, various studies have been made.

For example, Patent Document 1 describes as follows: when forming an internal electrode of copper at an interface between two types of ferroelectric oxides having different dielectric constants, occurrence of peeling can be suppressed by adding a component common to an additive component of at least one type of oxide to the internal electrode.
Patent Document 1: Japanese Unexamined Patent Application, Publication No. 2011-119343

DISCLOSURE OF THE INVENTION

Problems to be Solved by the Invention

In Patent Document 1, in order to ensure interfacial adhesion strength by adding to an electrode an additive component of an oxide that is adjacent to the electrode, sintering is performed at a high temperature of 800 to 1,000° C. However, during a process of cooling from a sintering temperature to a room temperature, thermal stress resulting from a large temperature difference increases, and there is a possibility that the ceramic substrate may easily break. Therefore, adhesion between the copper electrode and the ceramic substrate is not sufficient. There is still room for improvement in increasing the adhesion between the copper electrode and the ceramic substrate.

The present invention has been made in view of the above circumstances, and it is an object of the present invention to provide an electronic component in which a copper electrode and an inorganic substrate exhibit strong adhesion to each other.

Means for Solving the Problems

The present inventors have found that in an electronic component obtained by applying a paste containing copper particles, copper oxide particles and/or nickel oxide particles, and inorganic oxide particles having a softening point to an inorganic substrate, and then heating at a temperature equal to or higher than a sintering temperature of the copper particles and lower than the softening point of the inorganic oxide particles in an inert gas atmosphere to form a sintered body including at least copper, followed by a softening step of heating at a temperature equal to or higher than the softening point of the inorganic oxide particles in an inert gas atmosphere, the metal electrode and the inorganic substrate exhibit strong adhesion to each other even when an inexpensive copper electrode is mainly used, and have completed the present invention. Specifically, the present invention provides the following.

A first aspect of the present invention relates to a method for producing an electronic component, the method including:
 an application step of applying a paste to an inorganic substrate,
  the paste containing copper particles, copper oxide particles and/or nickel oxide particles, and inorganic oxide particles having a softening point;
 a sintering step of forming a sintered body including at least copper through heating in an inert gas atmosphere at a temperature equal to or higher than a sintering temperature of the copper particles and lower than the softening point of the inorganic oxide particles; and
 a softening step of performing heating in an inert gas atmosphere at a temperature equal to or higher than the softening point of the inorganic oxide particles.

A second aspect of the present invention relates to the method for producing an electronic component as described in the first aspect, in which a content of the oxide particles in the paste is 0.1% by mass or more and 10% by mass or less with respect to the copper particles.

A third aspect of the present invention relates to a method for producing an electronic component, including:
 a first application step of applying a first paste to an inorganic substrate,
  the first paste containing copper particles, copper oxide particles and/or nickel oxide particles, and inorganic oxide particles having a softening point;
 a second application step of applying a second paste,
  the second paste containing copper particles, oxide particles containing copper and/or nickel, and no inorganic oxide component having a softening point
  or
  the second paste containing copper particles, oxide particles containing copper and/or nickel, and an inorganic oxide component having softening point in a content of less than 0.1% by mass;
a sintering step of forming a sintered body including at least copper through heating in an inert gas atmosphere at a temperature equal to or higher than the sintering temperature of the copper particles and lower than the softening point of the inorganic oxide particles; and
a softening step of performing heating in an inert gas atmosphere at a temperature equal to or higher than the softening point of the inorganic oxide particles.

A fourth aspect of the present invention relates to a method for producing an electronic component, the method including:
a first application step of applying a first paste to an inorganic substrate,
the first paste containing copper particles, copper oxide particles and/or nickel oxide particles, and inorganic oxide particles having a softening point;
a first sintering step of forming a sintered body including at least copper through heating in an inert gas atmosphere at a temperature equal to or higher than a sintering temperature of the copper particles and lower than the softening point of the inorganic oxide particles;
a softening step of performing heating in an inert gas atmosphere at a temperature equal to or higher than the softening point of the inorganic oxide particles;
a second application step of applying a second paste,
the second paste containing copper particles, the oxide particles, and no inorganic oxide component having a softening point or
the second paste containing copper particles, oxide particles containing copper and/or nickel, and an inorganic oxide component having a softening point in a content of less than 0.1% by mass; and
a second sintering step of forming a sintered body including at least copper through heating in an inert gas atmosphere at a temperature equal to or higher than the sintering temperature of the copper particles.

A fifth aspect of the present invention relates to the method for producing an electronic component as described in any one of the first to fourth aspects, in which the softening point of the inorganic oxide particles is 550° C. or higher and 750° C. or lower.

A sixth aspect of the present invention relates to the method for producing an electronic component as described in any one of the first to fifth aspects, in which the inorganic oxide particles include three or more types of metal elements selected from the group consisting of B, Al, Si, Zn, Ba, Bi, Ca, Mg, Sr, Hf, K, Zr, Ti, and Na.

A seventh aspect of the present invention relates to an electronic component, including:
an adherent electrode member containing
a porous body including copper and
an inorganic oxide in a gap of the porous body; and
an inorganic substrate,
in which in the adherent electrode member, a content of the inorganic oxide in half of the adherent electrode member on a side in contact with the inorganic substrate is greater than a content of the inorganic oxide in another half of the adherent electrode member.

An eighth aspect of the present invention relates to an electronic component, including:
an electrode member containing copper;
an adherent electrode member containing
a porous body including copper and
an inorganic oxide in a gap of the porous body; and
an inorganic substrate,
in which in the adherent electrode member, a content of the inorganic oxide in half of the adherent electrode member on a side in contact with the inorganic substrate is greater than a content of the inorganic oxide in another half of the adherent electrode member.

A ninth aspect relates to an electronic component as described in the seventh or eighth aspect, in which the inorganic oxide includes three or more types of metal elements selected from the group consisting of B, Al, Si, Zn, Ba, Bi, Ca, Mg, Sr, Hf, K, Zr, Ti, and Na.

Effects of the Invention

According to the present invention, an electronic component in which a copper electrode and an inorganic substrate has a strong adhesion can be obtained.

PREFERRED MODE FOR CARRYING OUT THE INVENTION

Figure 1:
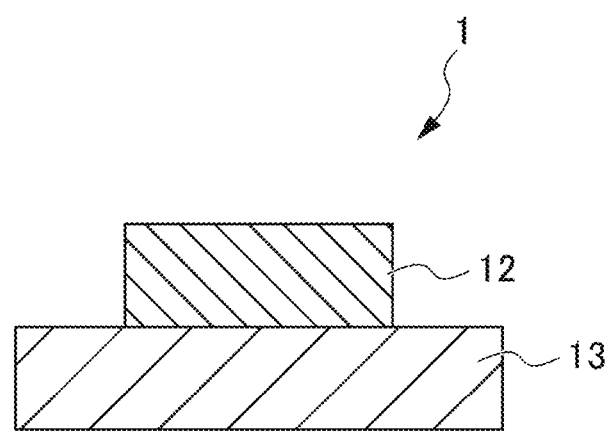
FIG. 1 is a schematic cross-sectional view of the electronic component of a first embodiment.

Hereinafter, a specific embodiment of the present invention will be described in detail. The present invention is not limited to the following embodiments in any way and can be implemented within the scope of the object of the present invention with appropriate modifications.

Production Method of the First Embodiment

The production method of the first embodiment includes an application step of applying a paste to an inorganic substrate, the paste containing copper particles, copper oxide particles and/or nickel oxide particles, and inorganic oxide particles having a softening point,
a sintering step of forming a sintered body including at least copper through heating in an inert gas atmosphere at a temperature equal to or higher than a sintering temperature of the copper particles and lower than a softening point of the inorganic oxide particles, and
a softening step of performing heating in an inert gas atmosphere at a temperature equal to or higher than the softening point of the inorganic oxide particles.

Note that, in this specification, "copper electrode" refers to an electrode containing copper as a main component (60% by mass or more) and does not exclude inclusion of other metals or the like when serving as an electrode.

[Application Step]

The application step is a step of applying a paste containing copper particles, copper oxide particles and/or nickel oxide particles, and inorganic oxide particles having a softening point to an inorganic substrate.

Note that with respect to "softening point", its presence or absence and a temperature thereof can be obtained using DTA.

[Inorganic Substrate]

The inorganic substrate is, for example, a semiconductor substrate, and has an oxide on at least a surface thereof. By having an oxide on the surface of the inorganic substrate, inorganic oxide particles are softened in a below-described softening step and the inorganic substrate reacts with a component derived from the inorganic oxide particles (with the component derived from the inorganic oxide particles referring to inorganic oxide particles that have been softened and filled in pores of a porous copper sintered body). The component derived from the inorganic oxide particles is included in voids of the porous body (electrode) generated by sintering the copper particles and the copper oxide particles and/or nickel oxide particles, and thus reacts with the inorganic substrate as described above, thereby being able to enhance adhesion between the electrode which is a porous body and the inorganic substrate.

The oxide present on a surface of an inorganic substrate 13 is not particularly limited, and examples thereof include insulators such as alumina, silicon dioxide, etc. or a ferroelectric material such as lithium niobium oxide, titanium barium oxide, etc.

Except for the surface, the substrate 13 may be composed of an insulating material, and silicon nitride, aluminum nitride, silicon carbide, and the like may be exemplified.

[Paste]

The paste contains at least copper particles, copper oxide particles and/or nickel oxide particles, and inorganic oxide particles having a softening point. The copper particles and the copper oxide particles and/or nickel oxide particles turn into a porous body of conductive metals by being sintered, and the porous body acts as an electrode of an electronic component obtained.

An example of such a paste contains copper particles, copper oxide particles and/or nickel oxide particles, a binder resin, and a solvent. Note that hereinafter, an organic component mainly composed of a binder resin, a solvent, and the like is referred to as an "organic vehicle".

(Copper Particles)

The copper particles are not particularly limited, but are particles produced by a method such as a gas atomization method, a water atomization method, or a liquid phase reduction deposition method, and preferably have a 50% particle diameter of 70 nm or more and 10 µm or less.

Particle diameters of the copper particles are not particularly limited, but are preferably, for example, 0.3 µm or more, and more preferably 0.5 µm or more. With an average particle size of the copper particles being 0.3 µm or more, it is possible to form a gap between sintered copper particles. When the average particle of the copper particles is less than 0.3 µm, the gap between the copper particles that have been densely sintered in the sintering step is so small that the inorganic oxide does not reach the interface in the subsequent softening step, resulting in poor adhesion. When the average particle of the copper particles is 0.5 µm or more, the adhesion strength is further increased. Note that the average particle size of the copper particles is a value measured by a laser diffraction particle size analyzer such as Microtrack, etc.

(Copper Oxide Particles and/or Nickel Oxide Particles)

Copper oxide particles contain at least either cuprous oxide or copper oxide. Further, the nickel oxide particles contain nickel oxide. Since these oxide particles have a low standard free energy of oxide formation, they are easily reduced to a conductive metal.

As described above, a resin is contained as a binder in the paste. Here, if the binder remains in the electrode even after sintering, the conductivity of the electrode may be lowered. Therefore, it is necessary to remove such a binder. However, in the production method as described in the present embodiment, all heating needs to be performed in an inert atmosphere. Therefore, it is necessary to supply oxygen by a different means other than the gas atmosphere. Here, upon sintering a paste to which copper oxide particles or nickel oxide particles have been added, oxygen is supplied from the oxide particles to the resin by heating even in an inert gas atmosphere and thereby, the resin is decomposed and removed. As a result, it is possible to obtain a good sintered body of copper particles.

A content of the copper oxide particles and/or nickel oxide particles in the paste (a sum of the both metal oxide particles) is not particularly limited, but is preferably 0.1% by mass or more, more preferably 0.2% by mass or more, and most preferably 0.5% by mass or more, with respect to the mass of the copper particles, for example. With the content of the copper oxide particles and/or nickel oxide particles being 0.1% by mass or more, it is possible to supply a sufficient amount of oxygen to the resin and further promote decomposition of the resin. On the other hand, the content of the copper oxide particles and/or nickel oxide particles is preferably 10% by mass or less, more preferably 9% by mass or less, more preferably 8% by mass or less, and particularly preferably 7% by mass or less. With the content of the copper oxide particles and/or nickel oxide particles being 10% by mass or less, it is possible to completely reduce the copper oxide particles and/or nickel oxide particles and decrease electric resistance of the porous body (electrode) to a lower level. Note that, when weighing a required amount of oxide particles, since the resin content in the paste is a trace amount, it is possible to make the paste contain an appropriate amount of the oxide particles with high accuracy by weighing the oxide particles based on the mass of the copper particles as a main component in the paste.

An average particle size of the copper oxide particles and/or nickel oxide particles is not particularly limited, but is preferably 0.1 µm or more, more preferably 0.2 µm or more, and most preferably 0.3 µm or more, in terms of a 50% average particle size ($D_{50}$) in a laser diffractive particle size distribution, for example. With the average particle size of the copper oxide particles and/or nickel oxide particles being 0.1 µm or more, it is possible to prevent aggregation of the copper oxide particles and/or nickel oxide particles with each other and to thereby make more copper oxide particles and/or nickel oxide particles contribute to decomposition. Further, the average particle size of the copper oxide particles and/or nickel oxide particles is preferably 10 µm or less, more preferably 9 µm or less, more preferably 8 µm or less, and particularly preferably 7 µm or less. With the average particle size of the copper oxide particles and/or nickel oxide particles being 10 µm or less, it is possible to enhance printability of the copper paste more significantly.

(Inorganic Oxide Particles)

The inorganic oxide particles are those having a softening point. As described above, with the inorganic oxide having a softening point, it is possible to soften the inorganic oxide in the below-described softening step and to make the inorganic oxide migrate inside the porous sintered body through pores to the vicinity of the inorganic substrate.

It is preferable that the inorganic oxide particles contain three or more types of metal elements selected from the group consisting of B, Al, Si, Zn, Ba, Bi, Ca, Mg, Sr, Hf, K, Zr, Ti, and Na. By including an oxide of a plurality of metal elements as described above, the softening point tends to easily occur.

The softening point of the inorganic oxide particles is not particularly limited, but is preferably, for example, 550° C. or higher, more preferably 570° C. or higher, more preferably 590° C. or higher, and particularly preferably 600° C. or higher. With the softening point being 550° C. or higher, it is possible to differentiate from the sintering temperature of the copper particles and to thereby suppress softening in the sintering step. On the other hand, the softening point is preferably 750° C. or lower, more preferably 740° C. or lower, more preferably 720° C. or lower, and most preferably 700° C. or lower. With the softening point being 750° C. or lower, it is possible to prevent the component derived from the inorganic oxide particles and the inorganic substrate from reacting with each other, releasing a gas, and forming bubble-like voids at the interface, thereby being able to enhance the adhesion strength between the inorganic substrate and the porous body of copper, which is generated by sintering of the copper particles.

A content of the inorganic oxide particles in the paste is not particularly limited, but is preferably 0.4% by mass or more, and more preferably 1.0% by mass or more, with respect to the mass of the copper particles, for example. With the content of the inorganic oxide particles being 0.4% by mass or more, it is possible to increase an amount of the inorganic oxide that migrates to the interface with the inorganic substrate in the softening step, and to thereby ensure the adhesion strength with the inorganic substrate. Further, by setting the content of the inorganic oxide particles to 1.0% by mass or more, the adhesion strength can be further increased. On the other hand, the content of the inorganic oxide particles is preferably 20% by mass or less, more preferably 10% by mass or less, more preferably 4.8% by mass or less, and particularly preferably 4% by mass or less. With the content of the inorganic oxide particles being 20% by mass or less, the adhesion strength can be secured. Further, in particular, when the content of the inorganic oxide particles is 4.8% by mass or less, electric resistance can be decreased, while maintaining the adhesion strength.

An average particle size of the inorganic oxide particles is not particularly limited, but is preferably 0.5 μm or more, more preferably 0.7 μm or more, more preferably 1 μm or more, and particularly preferably 1.5 μm or more, for example, in terms of a 50% particle size ($D_{50}$) in a laser diffractive particle size distribution. With the average particle size of the inorganic oxide particles being 0.5 μm or more, aggregation of the particles can be prevented, which improves printability of the paste, and also prevents formation of spherical voids in the sintered body, thereby being able to increase the mechanical strength of the electronic component. On the other hand, the average particle size of the inorganic oxide particles is preferably 10 μm or less, more preferably 8 μm or less, more preferably 7 μm or less, and particularly preferably 5 μm or less. With the average particle shape of the inorganic oxide particles being 7 μm or less, glass can be uniformly and sufficiently imparted with heat, and it is possible to decrease inorganic oxide particles that are not softened in the below-described softening step. Thereby, it is possible to increase the adhesion strength between the porous body generated by sintering of copper and the inorganic substrate.

(Binder Resin)

A content percentage of the binder resin in the organic vehicle is preferably 0.05% by mass or more and 17% by mass or less. The binder resin is not particularly limited as long as it is a resin that can be decomposed by heating, and examples thereof include cellulose resins such as methylcellulose, ethylcellulose, carboxymethyl cellulose, etc., acrylic resins, butyral resins, alkyd resins, epoxy resins, phenolic resins, and the like. Among the above, a cellulose-based resin, which tends to easily disappear from the paste by reacting with oxygen or carbon monoxide, is preferably used, and among the cellulose-based resins, ethyl cellulose is more preferably used.

Upon heating a binder resin together with a conductive metal oxide in an inert atmosphere, the binder resin reacts with the conductive metal oxide, which reduces an amount of the resin remaining in wiring after sintering to an extremely low level, thereby suppressing an increase in wiring resistance due to the residual resin. However, there is still a possibility that the binder resin component may remain in the wiring and the wiring resistance increases as well as sinterability deteriorates. Thus, by reducing the content of the binder resin in the organic vehicle to less than 17.0% by mass, it is possible to neglect an influence on the wiring resistance by the binder resin component remaining in the wiring after sintering. On the other hand, when the content of the binder resin in the organic vehicle is less than 0.05% by mass, the viscosity of the paste may be reduced, and the printability may be deteriorated.

(Solvent)

A solvent contained in the conductive paste is not particularly limited, as long as it has an appropriate boiling point, vapor pressure, and viscosity, but examples thereof include hydrocarbon-based solvents, chlorinated hydrocarbon-based solvents, cyclic ether-based solvents, amide-based solvents, sulfoxide-based solvents, ketone-based solvents, alcohol-based compounds, ester-based solvents of polyvalent alcohols, ether-based solvents of polyvalent alcohols, terpen-based solvents and mixtures thereof. Among these, it is preferable to use texanol, butyl carbitol, butyl carbitol acetate, and terpineol having a boiling point in the vicinity of 200° C.

(Other Components in Organic Vehicle)

An organic vehicle refers to a liquid obtained by mixing a binder resin, a solvent, and other organic substances to be added as necessary. When sintering is performed in an atmosphere described in the present invention, it is sufficient to use an organic vehicle prepared by mixing a binder resin and a solvent, but if necessary, a metal salt and a polyol can be mixed and used. Examples of the metal salt include copper (II) acetate, copper (II) benzoate, and bis (acetylacetonate) copper (II) when Cu is used as a first metal element, for example. Further, examples of the polyol include ethylene glycol, diethylene glycol, trimethylene glycol, propylene glycol, and tetraethylene glycol. Upon adding these, the polyols reduce metal salts during sintering, and reduced metals are precipitated in the voids between the particles and act to enhance the electrical conductivity between the particles.

A content of the above organic vehicle contained in the paste is not particularly limited, but is preferably, for example, 3% by mass or more and 19% by mass or less, and more preferably 8% by mass or more and 15% by mass or less.

By setting the content of the organic vehicle contained in the paste to 3% by mass or more and 19% by mass or less, a wiring shape can be maintained well. When the content of the organic vehicle is more than 19% by mass, the viscosity of the paste is low, so that sagging may occur in a printed wiring shape. On the other hand, when the content of the organic vehicle is less than 3% by mass, the viscosity of the paste is too high, so that wiring having a uniform shape may not be formed.

[Method for Producing Paste]

The paste can be produced by mixing a solvent with the binder resin described above, and further adding copper particles, copper oxide particles and/or nickel oxide particles and kneading the obtained mixture using an apparatus such as a planetary mixer. Further, it is also possible to enhance dispersibility of these particles using a three-roll mill if necessary.

Further, a method for applying the paste is not particularly limited, and for example, an ink jet method, a dispensing method, a screen-printing method, or the like can be used.

Further, it is preferable to dry the inorganic substrate coated with the paste at room temperature or at a high temperature as appropriate to remove a predetermined amount of the solvent.

[Sintering Step]

The sintering step is a step of forming a sintered body including at least copper, the step including heating the inorganic substrate obtained in the application step described above and coated with the paste, in an inert gas atmosphere at a temperature equal to or higher than the sintering temperature of the copper particles and lower than the softening point of the inorganic oxide particles.

Upon sintering the paste in this way, the copper particles and copper oxide particles and/or nickel oxide are sintered, and the surface of these particles are connected to each other to form a porous body. In other words, the porous body thus obtained is composed of copper (when nickel oxide is not used) or composed of copper and nickel (when nickel oxide is used) (hereinafter, for convenience's sake, the porous body is collectively referred to as a "copper porous body", including a case in which nickel is also included). Note that oxygen is supplied by heating during this time from the copper oxide particles and/or nickel oxide to the resin present from the paste, and the resin is decomposed. On the other hand, since heating is performed at a temperature lower than the softening point, no change occurs in the inorganic oxide particles at this point of time.

The heating temperature in the sintering step is not particularly limited, as long as the heating temperature is equal to or higher than the sintering temperature of the copper particles and lower than the softening point of the inorganic oxide particles, but is preferably, for example, 400° C. or higher, more preferably 450° C. or higher, more preferably 470° C. or higher, and particularly preferably 500° C. or higher. On the other hand, the heating temperature is preferably lower than 750° C., more preferably 700° C. or lower, more preferably 650° C. or lower, and particularly preferably 620° C. or lower.

Further, the heating temperature in the sintering step is not particularly limited but is preferably lower than the softening point of the inorganic oxide particles by 30° C. or more, more preferably 50° C. or more, more preferably 70° C. or more, and particularly preferably 100° C. or more. With the heating temperature being lower than the softening point of the inorganic oxide particles by 30° C. or more, it is possible to prevent the inorganic oxide particles from softening more securely in this sintering step.

Heating time in the sintering step is not particularly limited, but is preferably, for example, 5 minutes or more, and more preferably 15 minutes or more. Further, the heating time is preferably 60 minutes or less, and more preferably 45 minutes or less. With the heating time being within the above range, it is possible to sufficiently sinter the copper particles.

As the inert atmosphere, any atmosphere substantially free of an oxidizing gas or a reducing gas may be used, and for example, a nitrogen atmosphere, a helium atmosphere, an argon atmosphere, or the like may be used. Among them, a nitrogen atmosphere is preferred from the viewpoint of cost. Note that it is acceptable for even an inert atmosphere to contain, for example, 100 ppm or less of an oxidizing gas or a reducing gas, because there is a limit in eliminating an oxidizing gas or a reducing gas from an apparatus for performing the implementation.

Note that, with regard to the inorganic oxide particles, inorganic oxide particles including one type of composition can be used singly or plural types of compositions may be mixed and used. In a case in which plural types of inorganic oxides are used, the phrase "lower than the softening point of the inorganic oxide particles" is defined based on an inorganic oxide that has the lowest softening point, among the plural types of inorganic oxides.

[Softening Step]

The softening step is a step of heating in an inert gas atmosphere at a temperature equal to or higher than the softening point of the inorganic oxide particles.

When heated in this manner, the inorganic oxide particles soften and migrate to the vicinity of the inorganic substrate, passing through pores of the copper porous body as a passage. Then, a component derived from the inorganic oxide particles reacts with the inorganic substrate and is integrated, thereby enhancing the adhesion strength between the copper porous body and the inorganic substrate.

As the inert atmosphere, as in the sintering step described above, any atmosphere substantially free of an oxidizing gas or a reducing gas may be used, and for example, a nitrogen atmosphere, a helium atmosphere, an argon atmosphere, or the like may be used. Among them, a nitrogen atmosphere is preferred from the viewpoint of cost. Note that it is acceptable for even an inert atmosphere to contain, for example, 100 ppm or less of an oxidizing gas or a reducing gas, because there is a limit as to how much of an oxidizing gas or a reducing gas can be eliminated from an apparatus for performing the implementation.

The heating temperature in the softening step is not particularly limited, as long as the heating temperature is equal to or higher than the softening point of the inorganic oxide particles, but is preferably, for example, 600° C. or higher, more preferably 620° C. or higher, and most preferably 650° C. or higher. With the heating temperature being 600° C. or higher, it is possible to integrate the inorganic substrate and the component derived from the inorganic oxide particles, thereby enhancing the adhesion between the inorganic substrate and the copper sintered body. Further, the heating temperature is preferably 900° C. or lower, more preferably 870° C. or lower, and most preferably 850° C. or lower. With the heating temperature being 900° C. or lower, it is possible to suppress bubbles from being generated by evaporation of the metal component and thereby suppressing the adhesion between the inorganic substrate and the copper sintered body from decreasing.

Further, the heating temperature in the softening step is preferably higher than the softening point of the inorganic oxide particles by 30° C. or more, more preferably 50° C. or more, and most preferably 70° C. or more. With the heating temperature being higher than the softening point of the inorganic oxide particles by 30° C. or more, it is possible to make the inorganic oxide particles more easily soften.

Heating time in the softening step is not particularly limited, but is preferably, for example, 5 minutes or more, and more preferably 15 minutes or more. Further, the heating time is preferably 60 minutes or less, and more preferably 45 minutes or less. When the heating time is in the range of the above, it is possible to make the softened inorganic oxide particles migrate sufficiently to the vicinity of the inorganic substrate.

Note that, with regard to the inorganic oxide particles, while inorganic oxide particles of one type or plural types may be used, in a case in which plural types of inorganic oxides are used, the phrase "equal to or higher than the softening point of the inorganic oxide particles" is defined based on an inorganic oxide that has the highest softening point, among the plural types of inorganic oxides.

The Production Method of the Second Embodiment

The production method as described in the second embodiment includes
- a first application step of applying a first paste to an inorganic substrate,
  - the first paste containing copper particles, copper oxide particles and/or nickel oxide particles, and inorganic oxide particles having a softening point;
- a second application step of applying a second paste,
  - the second paste containing copper particles, oxide particles containing copper and/or nickel, and no inorganic oxide component having a softening point or
  - the second paste containing copper particles, oxide particles containing copper and/or nickel, and an inorganic oxide component having softening point in a content of less than 0.1% by mass;
- a sintering step of forming a sintered body including at least copper through heating in an inert gas atmosphere at a temperature equal to or higher than a sintering temperature of the copper particles and lower than the softening point of the inorganic oxide particles; and
- a softening step of performing heating in an inert gas atmosphere at a temperature equal to or higher than the softening point of the inorganic oxide particles.

In other words, the production method of the second embodiment includes the second application step as compared with the production method of the first embodiment described above.

[First Application Step]

The first application step is a step of applying the first paste containing copper particles, copper oxide particles and/or nickel oxide particles and inorganic oxide particles having a softening point to an inorganic substrate. Since this first application step is the same as the application step in the production method of the first embodiment, a detailed description thereof will be omitted here. In this case, "paste" in the production method of the first embodiment shall be read as a "first paste".

[Second Application Step]

The second application step is a step of applying a second paste, with the second paste containing copper particles, oxide particles containing copper and/or nickel, and no inorganic oxide component having a softening point or with the second paste containing copper particles, oxide particles containing copper and/or nickel, and an inorganic oxide component having a softening point in a content of less than 0.1% by mass. Since this second application step differs from the application step in the production method of the first embodiment only in that the second paste (corresponding to the "paste" in the production method of the first embodiment) contains no inorganic oxide component having a softening point or contains the same in a content of less than 0.1% by mass with respect to the second paste, a detailed description thereof other than the second paste will be omitted here.

An electrode member (copper electrode) formed by the second paste is disposed for the purpose of electrically connecting a plurality of systems of wires, which are electrically connected. Therefore, a higher conductivity is desired, and as the second paste, a paste containing no inorganic oxide component having a softening point or containing the inorganic oxide component having a softening point in a content of less than 0.1% by mass (a trace amount) is used.

The "inorganic oxide component" that is set forth as being not contained in the second paste or being contained in a content of less than 0.1% by mass with respect to the second paste is not limited to the component constituting the "inorganic oxide particles having a softening point" used in the first application step, and is a concept encompassing all inorganic oxide particles having a softening point. Note that since the oxide particles containing copper and/or nickel do not have a softening point, they are excluded from the inorganic oxide component.

[Sintering Step]

The sintering step is a step of forming a sintered body including at least copper by heating in an inert gas atmosphere at a temperature equal to or higher than the sintering temperature of the copper particles and lower than the softening point of the inorganic oxide particles. Since this sintering step is the same as the sintering step in the production method of the first embodiment, a detailed description thereof will be omitted.

[Softening Step]

The softening step is a step of heating in an inert gas atmosphere at a temperature equal to or higher than the softening point of the inorganic oxide particles. Since this softening step is the same as the softening step in the production method of the first embodiment, a detailed description thereof will be omitted.

As described above, the production method of the second embodiment includes the second application step in addition to the production method of the first embodiment. By applying the paste containing copper particles, oxide particles containing copper and/or nickel, and no inorganic oxide component having a softening point or containing the same only in a small amount in this second step, a copper skeleton having no inorganic oxide component having a softening point is formed. With this portion, it is possible to further increase the conductivity of the electronic component to be formed.

Production Method of Third Embodiment

The same electronic component as that obtained by the production method of the second embodiment, i.e., an electronic component having a copper skeleton body having no inorganic oxide component having a softening point, can also be produced by the following method. Specifically, the production method of the third embodiment includes:
- a first application step of applying a first paste to an inorganic substrate,
  - the first paste containing copper particles, copper oxide particles and/or nickel oxide particles, and inorganic oxide particles having a softening point;
- a first sintering step of forming a sintered body including at least copper through heating in an inert gas atmosphere at a temperature equal to or higher than a sintering temperature of the copper particles and lower than the softening point of the inorganic oxide particles;
- a softening step of performing heating in an inert gas atmosphere at a temperature equal to or higher than the softening point of the inorganic oxide particles;

a second application step of applying a second paste,
the second paste containing copper particles, the oxide particles, and no inorganic oxide component having a softening point or
the second paste containing copper particles, oxide particles containing copper and/or nickel, and an inorganic oxide component having a softening point in a content of less than 0.1% by mass; and
a second sintering step of forming a sintered body including at least copper through heating in an inert gas atmosphere at a temperature equal to or higher than the sintering temperature of the copper particles.

That is, the production method of the third embodiment is a method in which sintering is performed after the application of the first paste, and then sintering is also performed after the application of the second paste. Namely, sintering of the pastes is performed twice. In contrast, in the production method of the second embodiment described above, sintering is not performed after the application of the first paste, but after the application of the second paste, the first and second pastes are concurrently sintered.

[First Application Step]

The first application step is a step of applying a first paste containing: copper particles, copper oxide particles and/or nickel oxide particles, and inorganic oxide particles having a softening point to an inorganic substrate. Since this first application step is the same as the first application step in the production method of the second embodiment, a detailed description thereof will be omitted.

[First Sintering Step]

The first sintering step is a step of forming a sintered body including at least copper by heating at a temperature equal to or higher than the sintering temperature of the copper particles and lower than the softening point of the inorganic oxide particles in an inert gas atmosphere. Since this first sintering step is the same as the sintering step in the production method of the first embodiment, a detailed description thereof will be omitted.

[Second Application Step]

The second application step is a step of applying a first paste containing copper particles, copper oxide particles and/or nickel oxide particles, and inorganic oxide particles having a softening point to a substrate. Since this first application step is the same as the second application step in the production method of the second embodiment, a detailed description thereof will be omitted.

[Softening Step]

The softening step is a step of heating at a temperature equal to or higher than the softening point of the inorganic oxide particles in an inert gas atmosphere. Since this softening step is the same as the softening step in the production method of the first embodiment, a detailed description thereof will be omitted.

[Second Sintering Step]

The second sintering step is a step of forming a sintered body including at least copper by heating at a temperature equal to or higher than the sintering temperature of the copper particles in an inert gas atmosphere. This second sintering step is the same as the sintering step in the production method of the first embodiment, except for the heating temperature.

The heating temperature in the second sintering step is not particularly limited as long as the heating temperature is equal to or higher than the sintering temperature of the copper particles. Further, it is unnecessary for the heating temperature to be lower than the softening point of the inorganic oxide particles as in the first sintering step. However, the heating temperature in the second heating and sintering step, may be the same, for example, as the heating temperature in the sintering step in the production method of the first embodiment, and is, for example, preferably 400° C. or higher, more preferably 450° C. or higher, more preferably 470° C. or higher, and particularly preferably 500° C. or higher. Further, the heating temperature is preferably 700° C. or lower, more preferably 670° C. or lower, more preferably 650° C. or lower, and particularly preferably 620° C. or lower.

Electronic Component of the First Embodiment

Features of the electronic component obtained by the production method of the first embodiment described above (hereinafter, referred to as "electronic component of the first embodiment") will be described. FIG. 1 is a schematic cross-sectional view of the electronic component of the first embodiment. An electronic component 1 of the first embodiment includes an adherent electrode member 12 including an inorganic oxide in a gap of a porous body including copper, and an inorganic substrate 13. Such an electronic component 1 is constituted by stacking the adherent electrode member 12 and the inorganic substrate 13. Additionally, in the adherent electrode member 12, a content of the inorganic oxide in a half of a side in contact with the inorganic substrate 13 is greater than a content of the inorganic oxide in another half thereof.

[Adherent Electrode Member]

The adherent electrode member 12 contains an inorganic oxide in a gap of a porous body including copper. Additionally, in the adherent electrode member 12, a content of the inorganic oxide in a half of a side in contact with the below-described inorganic substrate 13 is greater than a content of the inorganic oxide in a half of a side in contact with the electrode member. Note that the term "adhesive" as used herein is intended to describe a material be attached to an inorganic substrate while being in contact therewith and is not intended to require an adhesion strength of, for example, a specific value or more.

The porous body is a skeleton body including at least copper. The porous body may include nickel as another element. That is, the porous body is composed of copper or composed of copper and nickel. Note that "composed of copper" or "composed of copper and nickel" also includes impurities of about 5% by mass at the maximum or those containing oxygen due to bonding by oxidation. In addition, the porous body may be a sintered body which is constituted, for example, by surfaces of particulate metal being mutually interconnected.

Elements constituting the inorganic oxide are not particularly limited, and for example, preferably include three or more types of metal elements selected from the group consisting of B, Al, Si, Zn, Ba, Bi, Ca, Mg, Sr, Hf, K, Zr, Ti, and Na. While each of these elements forms an oxide, by including oxides of at least three types of these metal elements, it is possible to adjust the softening point within the range between 550° C. and 750° C., thereby being able to increase the adhesion strength.

Further, it is preferable for the metal elements constituting the inorganic oxide to be integrated as an oxide with the below-described inorganic substrate 13 by the reaction thereof. With the metal elements constituting the inorganic oxide being integrated with the inorganic substrate 13 in this manner, it is possible to improve the adhesion strength between the adherent electrode member 12 and the inorganic substrate 13.

A content of the inorganic oxide is not particularly limited, but the content of the inorganic oxide particles contained in the electronic component 1 is preferably 10% or less, more preferably 5% or less in terms of an area occupancy ratio, with respect to the total electrode cross-sectional area. With the content being 10% or less, the electrical resistivity of the electrode is decreased, as well as mechanical reliability of the electrode is increased. Further, the electrical resistivity is further decreased by the content being 5% or less. Herein, the area occupancy ratio of the inorganic oxide can be obtained as follows: a sample is provided by cutting an electrode at its midpoint of a longitudinal direction in a direction perpendicular to the longitudinal direction, followed by polishing; the cross section is observed using a scanning electron microscope and a composition distribution map is obtained using an X-ray energy spectroscopic instrument; and assuming that an area of an entirety of the cross section of the electrode be a total cross-sectional area of the electrode, an area of a place in which the inorganic oxide is present is measured with respect to the total cross-sectional area of the electrode.

The thickness of the adherent electrode member 12 is not particularly limited, but is preferably, for example, 10 μm or more. With the thickness of the adherent electrode member 12 being 10 μm or more, which is sufficiently thicker than $D_{50}$ of the copper particles, surface unevenness due to a copper particle shape is relatively small as compared with the electrode thickness, and thereby wiring having a good shape can be obtained.

[Inorganic Substrate]

The substrate 13 is a substrate containing an oxide at least on a surface thereof. Here, the term "surface" refers to all sides in contact with at least the adherent electrode member 12. Since the same inorganic substrate as that described above can be used, detailed description thereof will be omitted here.

Electronic Component of the Second Embodiment

Figure 2:
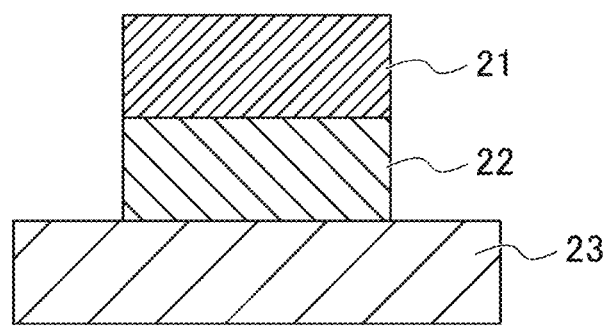
FIG. 2 is a schematic cross-sectional view of the electronic component of a second embodiment.

Features of the electronic component obtained by the production method of the second and third embodiments described above (hereinafter, generically referred to as "electronic component of the second embodiment") will be described. FIG. 2 is a schematic cross-sectional view of the electronic component of the second embodiment. An electronic component 2 of the second embodiment includes an electrode member 21 containing copper, an adherent electrode member 22 containing an inorganic oxide in a gap of a porous body including copper, and an inorganic substrate 23. In the adherent electrode member 22, a content of the inorganic oxide in a half of a side in contact with the inorganic substrate 23 is greater than a content of the inorganic oxide in another half thereof (in a side in contact with the electrode member 21).

That is, the electronic component of the second embodiment has a structure in which an electrode member is further provided on the adherent electrode member 12 of the electronic component of the first embodiment. Therefore, the adherent electrode member 22 in the electronic component of the second embodiment is the same as the adherent electrode 12 in the electronic component of the first embodiment described above. Further, the inorganic substrate 23 in the electronic component of the second embodiment is the same as the inorganic substrate 13 in the electronic component of the first embodiment. Therefore, description of the adherent electrode member 22 and the inorganic substrate 23 will be omitted here.

[Electrode Member]

The electrode member 21 is for electrically connecting a plurality of systems of wires that are electrically connected to the electrode member 21.

The electrode member 21 includes at least copper. As another element, nickel may be included. That is, the electrode member 21 is composed of copper or composed of copper and nickel.

The electrode member 21 may be a porous body (skeleton body) having a porous structure. In addition, this porous body may be a sintered body which is constituted such that the surfaces of particulate metal are mutually interconnected. With the electrode member 21 having such a porous structure, it is possible to absorb a certain extent of stress of the stresses applied to the electronic component 2, thereby further enhancing resistance against peeling, as the whole of the electronic component 2.

When the electrode member 21 has a porous structure, a volume fraction of the void is not particularly limited, but is preferably, for example, 2% by volume or more, more preferably 5% by volume or more, and most preferably 10% by volume or more. Further, the volume fraction of the void is preferably 40% by volume or less, and more preferably 35% or less.

It is preferable for the electrode member 21 not to contain an inorganic oxide other than oxides of copper and nickel. When such inorganic oxide particles are contained in the electrode member 21, conductivity decreases. Note that, although the electrode member 21 contains at least copper as a metal and may also contain nickel, these copper and nickel may be oxidized in the state of metal even in the atmosphere. Therefore, it is allowable to contain an oxide of copper or nickel up to a range in which conductivity is ensured (e.g., 5% by mass or less).

Further, the thickness of the electrode member 21 is not particularly limited but is preferably greater than the thickness of the below-described adherent electrode member 12. With the thickness of the electrode member 21 being greater than the thickness of the adherent electrode member 22, stress relaxation by the electrode member 21 having a porous structure is remarkable, thereby being able to increase the adhesion strength as the whole electronic component.

Electronic components described above can be used, for example, in high current substrates for power modules, insulating heat radiating substrates for LEDs, or the like.

EXAMPLE

Hereinafter, the present invention will be described in further detail with reference to the Example. The present invention is not limited by this Example.

A copper paste was prepared by kneading 100% by mass of approximately spherically shaped copper particles with $D_{50}$ of 1.0 μm, 2% by mass of $Cu_2O$ particles with $D_{50}$ of 0.3 μm, and a predetermined amount of inorganic oxide particles having a softening point with $D_{50}$ of 3 μm, together with a vehicle. This copper paste was printed on an alumina substrate in a thickness of about 150 μm by a screen-printing method, and after an air-drying step at 110° C. for 10 minutes, a sintering step and a softening step were performed in a nitrogen atmosphere to obtain an electrode. By using the obtained sample, a tensile jig was joined to an upper surface of the electrode using a solder alloy, and a peel strength between the electrode and the substrate was measured by pulling the jig. In addition, electrical resistivity was measured using a direct current four-point probe method.

The elements contained in the inorganic oxide particles (excluding oxygen), the addition amounts of the inorganic oxide particles (% by mass), the softening points of the inorganic oxide particles (° C.), the heating temperatures during the sintering step (° C.), the heating temperatures during the softening step (° C.), and the peel strength (MPa) and electrical resistivity (μΩ·cm) of the obtained electrodes are indicated in Table 1 below. The heating time of the sintering step was 10 minutes and the heating time of the softening step was 30 minutes. Note that in view of the relationship between the softening points and the heating temperatures in the softening step, some samples were not actually softened in the softening step, and the step is, however, referred to as "softening step" for convenience's sake.

TABLE 1

| | Element contained in inorganic oxide particles | Addition amount of inorganic oxide particles (% by mass) | Softening point of inorganic oxide particles (° C.) | Sintering step (° C.) | Softening step (° C.) | Peel strength (MPa) | Electrical resistivity (μΩ·cm) |
|---|---|---|---|---|---|---|---|
| Comparative Example 1 | Bi, Al, Si | 3 | 525 | 550 | 750 | 8 | 16 |
| Example 1 | B, Zn, Ba, Si, Bi | 1 | 645 | | | 34 | 2.9 |
| Example 2 | Ba, Zn, Si, Ca, Al | 3 | 640 | | | 23 | 3.1 |
| Example 3 | Zn, Si, Mg, Al | 3 | 656 | | | 27 | 3.2 |
| Comparative Example 2 | Si, Ca, Al, Na | 1 | 855 | | | 5 | 3.1 |
| Example 4 | B, Zn, Ba, Si, Bi | 1 | 645 | | | 30 | 2.7 |
| Example 5 | B, Zn, Ba, Si, Bi | 1 | 645 | | | 32 | 2.7 |

EXPLANATION OF REFERENCE NUMERALS 1 and 2 Electronic components
12 and 22 Adherent electrode members
13 and 23 Inorganic substrates
21 Electrode member

The invention claimed is:

1. A method for producing an electronic component, the method comprising:
applying a paste to an inorganic substrate,
the paste comprising copper particles, copper oxide particles and/or nickel oxide particles, and inorganic oxide particles having a softening point;
forming a sintered body comprising at least copper through heating in an inert gas atmosphere at a temperature being equal to or higher than a sintering temperature of the copper particles and lower than the softening point of the inorganic oxide particles as well as being in a range of 400° C. or more and 620° C. or less for 5 minutes or more and 60 minutes or less; followed by
performing heating in an inert gas atmosphere at a temperature being equal to or higher than the softening point of the inorganic oxide particles as well as being in a range of 650° C. or more and 870° C. or less for 5 minutes or more and 60 minutes or less.

2. The method for producing an electronic component according to claim 1, wherein a content of the copper oxide particles and/or nickel oxide particles in the paste is 0.1% by mass or more and 10% by mass or less with respect to the copper particles.

3. The method for producing an electronic component according to claim 1,
wherein the softening point of the inorganic oxide particles is 550° C. or higher and 750° C. or lower.

4. The method for producing an electronic component according to claim 1,
wherein the inorganic oxide particles include three or more types of metal elements selected from the group consisting of B, Al, Si, Zn, Ba, Bi, Ca, Mg, Sr, Hf, K, Zr, Ti, and Na.

5. The method for producing an electronic component according to claim 2,
wherein the softening point of the inorganic oxide particles is 550° C. or higher and 750° C. or lower.

6. The method for producing an electronic component according to claim 2,
wherein the inorganic oxide particles include three or more types of metal elements selected from the group consisting of B, Al, Si, Zn, Ba, Bi, Ca, Mg, Sr, Hf, K, Zr, Ti, and Na.

7. The method for producing an electronic component according to claim 1, wherein the electronic component comprising:
an electrode member comprising copper;
an adherent electrode member comprising
a porous body comprising copper and
an inorganic oxide in a gap of the porous body; and
an inorganic substrate,
wherein the porous body is attached to the inorganic substrate.

8. A method for producing an electronic component, comprising:
applying a first paste to an inorganic substrate,
the first paste comprising copper particles, copper oxide particles and/or nickel oxide particles, and inorganic oxide particles having a softening point;
applying a second paste,
the second paste comprising copper particles, oxide particles comprising copper and/or nickel, and no inorganic oxide component having a softening point or
the second paste comprising copper particles, oxide particles comprising copper and/or nickel, and an inorganic oxide component having softening point in a content of less than 0.1% by mass;

forming a sintered body comprising at least copper through heating in an inert gas atmosphere at a temperature being equal to or higher than the sintering temperature of the copper particles and lower than the softening point of the inorganic oxide particles as well as being in a range of 400° C. or more and 620° C. or less for 5 minutes or more and 60 minutes or less; followed by performing heating in an inert gas atmosphere at a temperature being equal to or higher than the softening point of the inorganic oxide particles as well as being in a range of 650° C. or more and 870° C. or less for 5 minutes or more and 60 minutes or less.

9. The method for producing an electronic component according to claim 8,
wherein the softening point of the inorganic oxide particles is 550° C. or higher and 750° C. or lower.

10. The method for producing an electronic component according to claim 8,
wherein the inorganic oxide particles include three or more types of metal elements selected from the group consisting of B, Al, Si, Zn, Ba, Bi, Ca, Mg, Sr, Hf, K, Zr, Ti, and Na.

11. The method for producing an electronic component according to claim 8, wherein the electronic component comprising:
an electrode member comprising copper;
an adherent electrode member comprising
a porous body comprising copper and
an inorganic oxide in a gap of the porous body; and
an inorganic substrate,
wherein the porous body is attached to the inorganic substrate.

12. A method for producing an electronic component, the method comprising:
applying a first paste to an inorganic substrate,
the first paste comprising copper particles, copper oxide particles and/or nickel oxide particles, and inorganic oxide particles having a softening point;
forming a sintered body comprising at least copper through heating in an inert gas atmosphere at a temperature being equal to or higher than a sintering temperature of the copper particles and lower than the softening point of the inorganic oxide particles as well as being in a range of 400° C. or more and 620° C. or less for 5 minutes or more and 60 minutes or less; followed by performing heating in an inert gas atmosphere at a temperature being equal to or higher than the softening point of the inorganic oxide particles as well as being in a range of 650° C. or more and 870° C. or less for 5 minutes or more and 60 minutes or less;

applying a second paste,
the second paste comprising copper particles, oxide particles comprising copper and/or nickel, and no inorganic oxide component having a softening point
or
the second paste comprising copper particles, oxide particles comprising copper and/or nickel, and an inorganic oxide component having a softening point in a content of less than 0.1% by mass; and
forming a sintered body comprising at least copper through heating in an inert gas atmosphere at a temperature equal to or higher than the sintering temperature of the copper particles.

13. The method for producing an electronic component according to claim 12,
wherein the softening point of the inorganic oxide particles is 550° C. or higher and 750° C. or lower.

14. The method for producing an electronic component according to claim 12,
wherein the inorganic oxide particles include three or more types of metal elements selected from the group consisting of B, Al, Si, Zn, Ba, Bi, Ca, Mg, Sr, Hf, K, Zr, Ti, and Na.

15. The method for producing an electronic component according to claim 12, wherein the electronic component comprising:
an electrode member comprising copper;
an adherent electrode member comprising
a porous body comprising copper and
an inorganic oxide in a gap of the porous body; and
an inorganic substrate,
wherein the porous body is attached to the inorganic substrate.

* * * * *